US008333004B2

(12) United States Patent
Bashan et al.

(10) Patent No.: US 8,333,004 B2
(45) Date of Patent: Dec. 18, 2012

(54) ELECTRONIC INTERFACE APPARATUS AND METHOD AND SYSTEM FOR MANUFACTURING SAME

(75) Inventors: Oded Bashan, Rosh-Pina (IL); Guy Shafran, Rosh-Pina (IL)

(73) Assignee: Smartrac IP B.V., Amsterdam (NL)

( * ) Notice: Subject to any disclaimer, the term of this patent is extended or adjusted under 35 U.S.C. 154(b) by 54 days.

(21) Appl. No.: 12/742,013

(22) PCT Filed: Oct. 23, 2008

(86) PCT No.: PCT/IL2008/001397
§ 371 (c)(1),
(2), (4) Date: Aug. 2, 2010

(87) PCT Pub. No.: WO2009/060425
PCT Pub. Date: May 14, 2009

(65) Prior Publication Data
US 2010/0293784 A1 Nov. 25, 2010

(30) Foreign Application Priority Data

Nov. 8, 2007 (WO) .................. PCT/IL2007/001378
Apr. 17, 2008 (WO) .................. PCT/IL2008/000538

(51) Int. Cl.
*H01S 4/00* (2006.01)
(52) U.S. Cl. ............ 29/592.1; 29/600; 29/854; 235/492
(58) Field of Classification Search ............ 29/830–832, 29/600, 592.1; 343/700 MS, 786; 235/492, 235/487; 340/572.1–572.7
See application file for complete search history.

(56) References Cited

U.S. PATENT DOCUMENTS

| 5,809,633 | A | | 9/1998 | Mundigi et al. |
| 5,880,934 | A | * | 3/1999 | Haghiri-Tehrani ............ 361/737 |
| 5,969,951 | A | * | 10/1999 | Fischer et al. ................ 361/737 |
| 6,081,025 | A | | 6/2000 | Prancz |
| 6,095,424 | A | | 8/2000 | Prancz |
| 6,378,774 | B1 | | 4/2002 | Emori et al. |
| 6,568,600 | B1 | | 5/2003 | Carpier et al. |
| 6,607,135 | B1 | | 8/2003 | Hirai et al. |
| 6,881,605 | B2 | | 4/2005 | Lee et al. |

(Continued)

FOREIGN PATENT DOCUMENTS

CN 1764932 A 4/2006

(Continued)

OTHER PUBLICATIONS

Supplementary Partial European Search Report, Application No. EP 08 84 7977, Jun. 8, 2011.

(Continued)

*Primary Examiner* — Minh Trinh
(74) *Attorney, Agent, or Firm* — Quarles & Brady LLP

(57) ABSTRACT

A method for manufacture of an electronic interface card including defining a pair of apertures in a substrate layer, associating an antenna with the substrate layer such that opposite ends of the antenna terminate at the apertures, placing a conductor in each of the apertures, connecting the antenna to the conductor, forming a recess in the substrate layer, attaching continuous connection wires to a plurality of chip modules, attaching the continuous connection wires to a plurality of conductors on a corresponding plurality of the substrate layers, cutting the continuous connection wires so as to retain portions thereof which connect each chip module to a corresponding pair of conductors and sealing the chip module in the recess.

9 Claims, 11 Drawing Sheets

U.S. PATENT DOCUMENTS

| | | | |
|---|---|---|---|
| 7,980,477 B2 * | 7/2011 | Finn | 235/492 |
| 8,186,603 B2 * | 5/2012 | Bashan et al. | 235/492 |
| 2003/0000070 A1 | 1/2003 | Lee et al. | |
| 2004/0206799 A1 | 10/2004 | Wong | |
| 2004/0245347 A1 | 12/2004 | Shibamoto et al. | |
| 2005/0202595 A1 | 9/2005 | Yonehara et al. | |
| 2007/0098942 A1 | 5/2007 | Cote et al. | |
| 2010/0200661 A1 * | 8/2010 | Shafran et al. | 235/492 |
| 2010/0293784 A1 * | 11/2010 | Bashan et al. | 29/854 |

FOREIGN PATENT DOCUMENTS

| | | |
|---|---|---|
| JP | 2006301691 A | 11/2006 |
| WO | 9705570 A1 | 2/1997 |
| WO | 9734247 A2 | 9/1997 |
| WO | 2004086289 A2 | 10/2004 |

OTHER PUBLICATIONS

The International Search Report as mailed on Feb. 19, 2009 for International Patent Application PCT/IL2008/001397.

The IPRP dated Oct. 27, 2009, Written Opinion and International Search Report as mailed on Sep. 2, 2008 for International Patent Application PCT/IL2008/001378.

The IPRP dated 0-Jan. 12, 2010 Written Opinion and International Search Report as mailed on Oct. 16, 2008 for International Patent Application PCT/IL2008/000538.

* cited by examiner

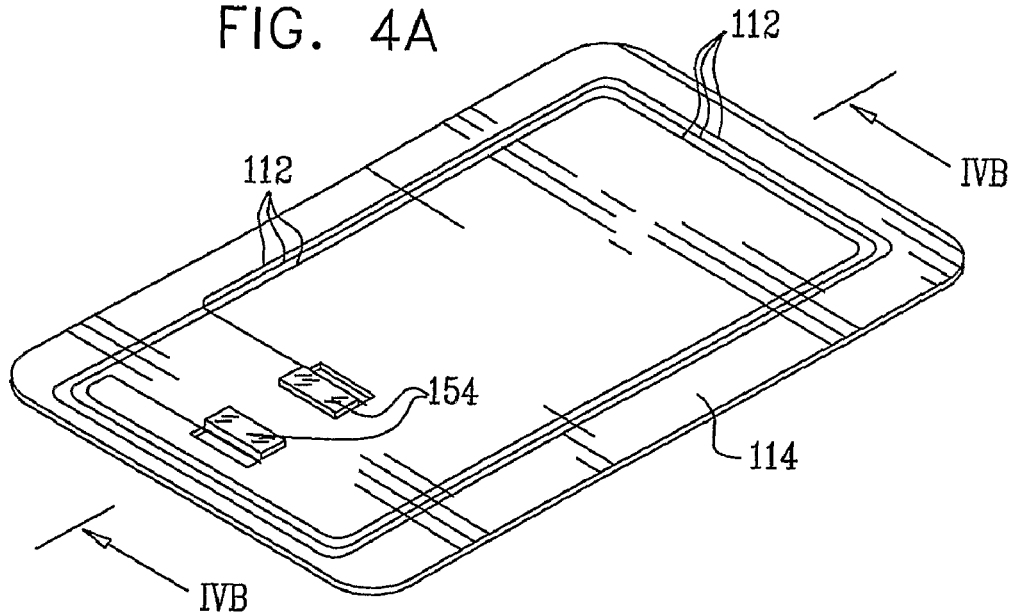
FIG. 4A
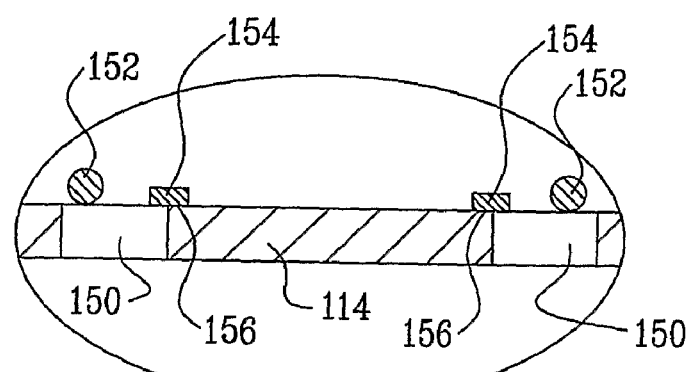
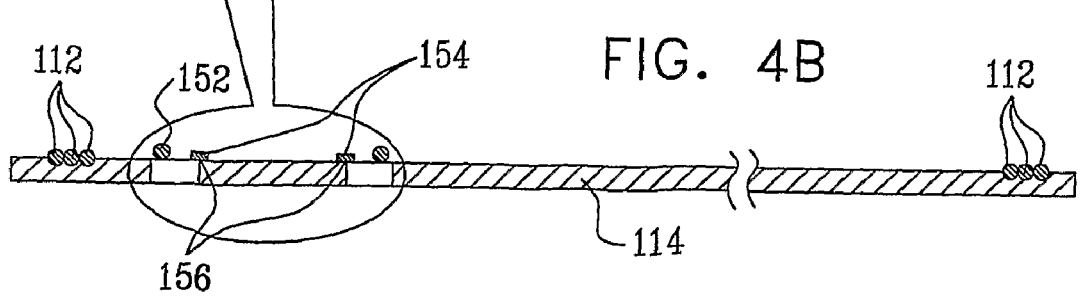
FIG. 4B

FIG. 5A
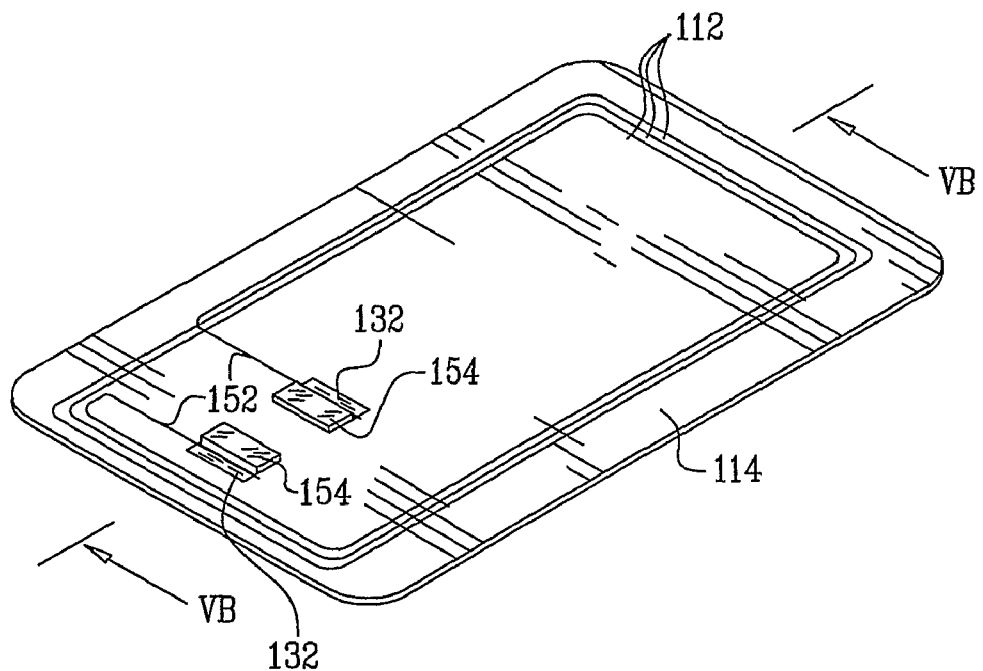
FIG. 5B
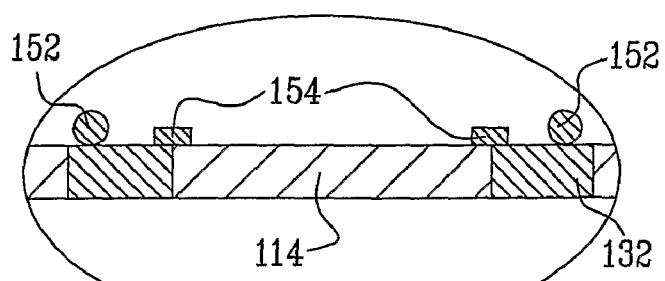
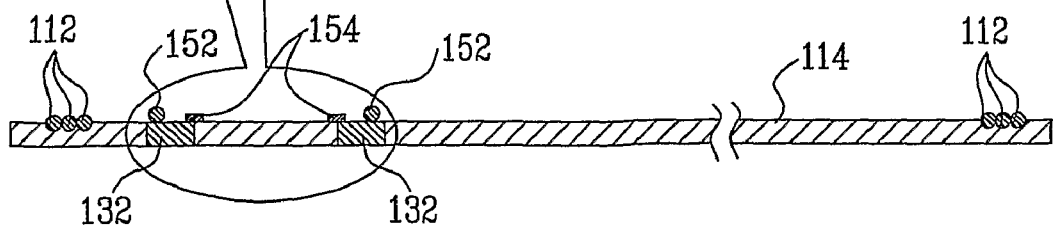

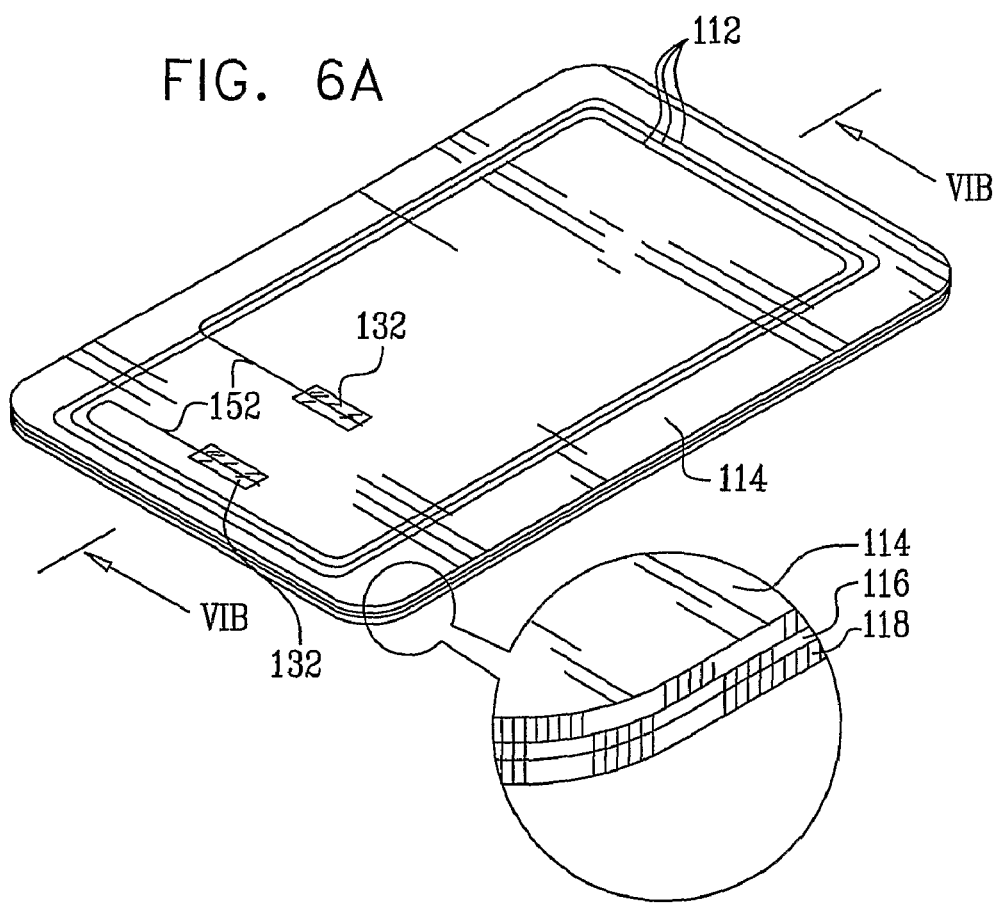
FIG. 6A
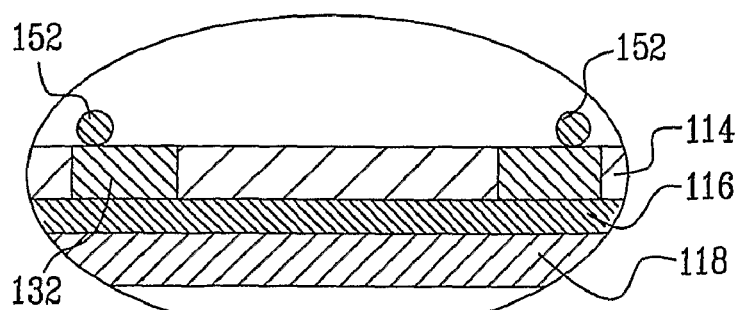
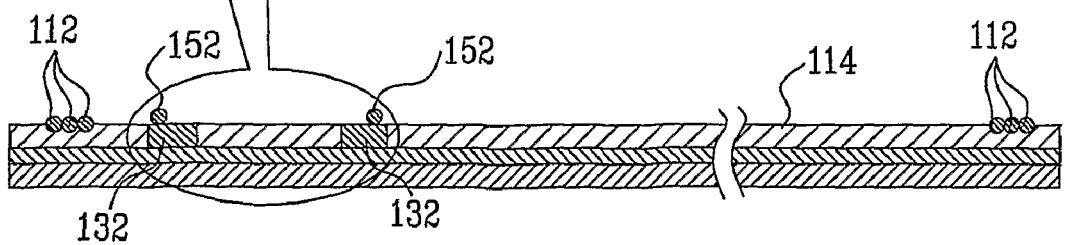
FIG. 6B

FIG. 7A
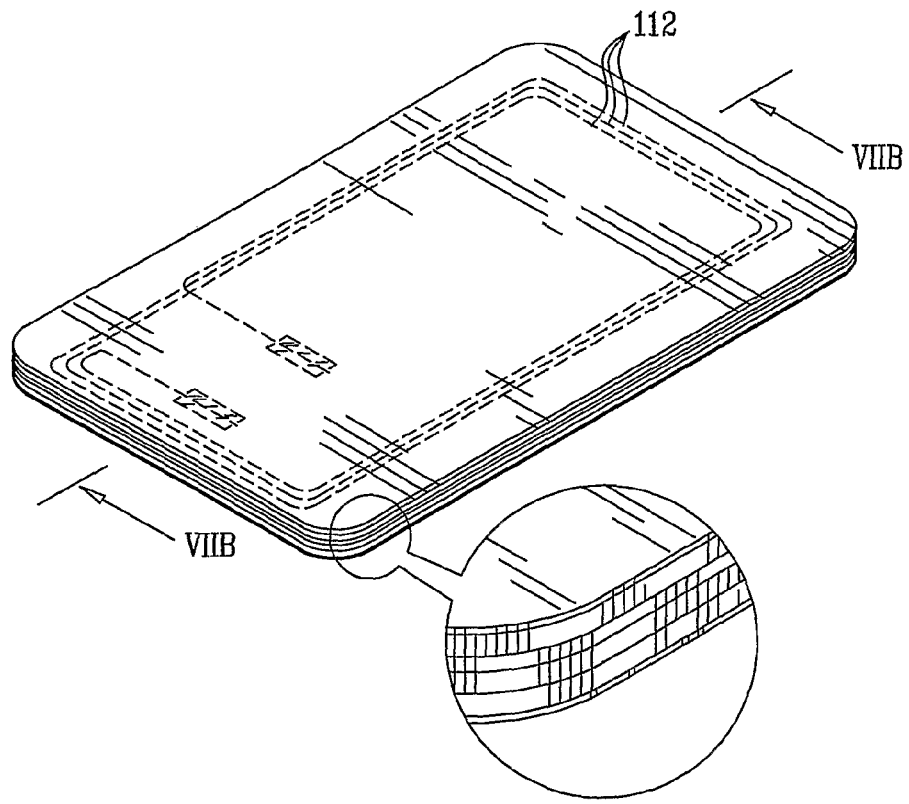
FIG. 7B
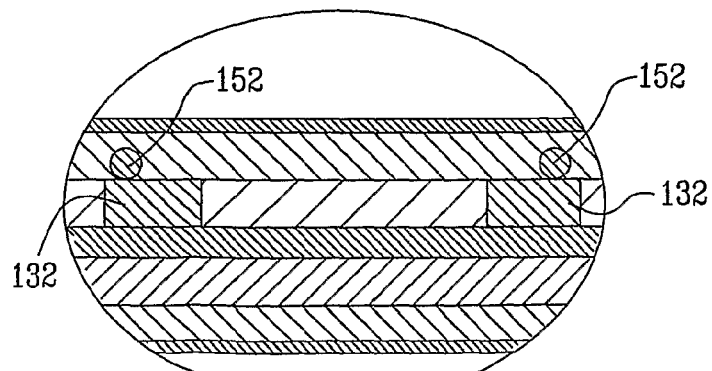
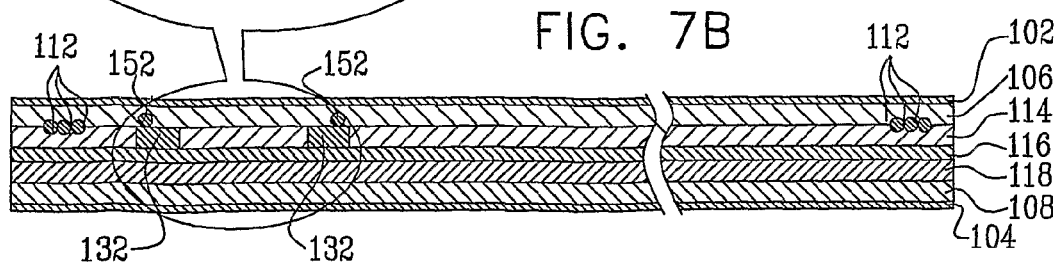

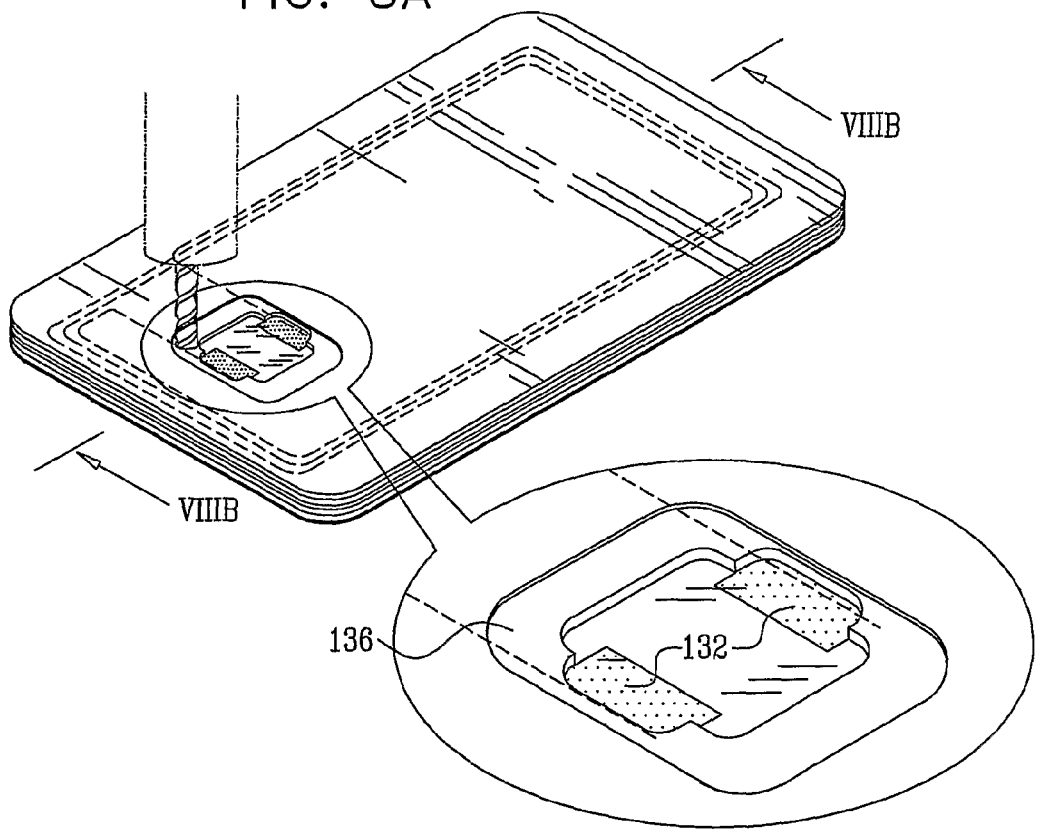
FIG. 8A
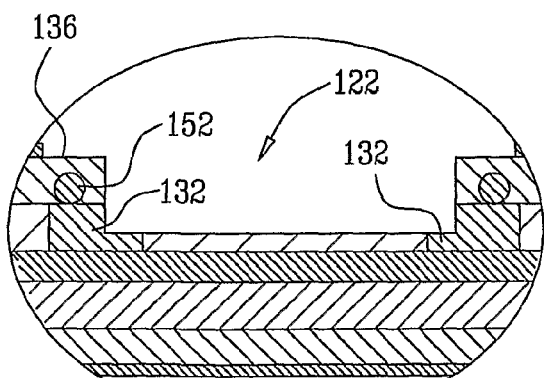
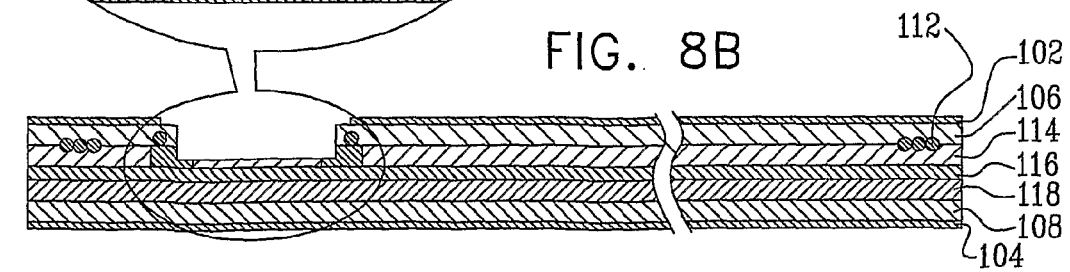
FIG. 8B

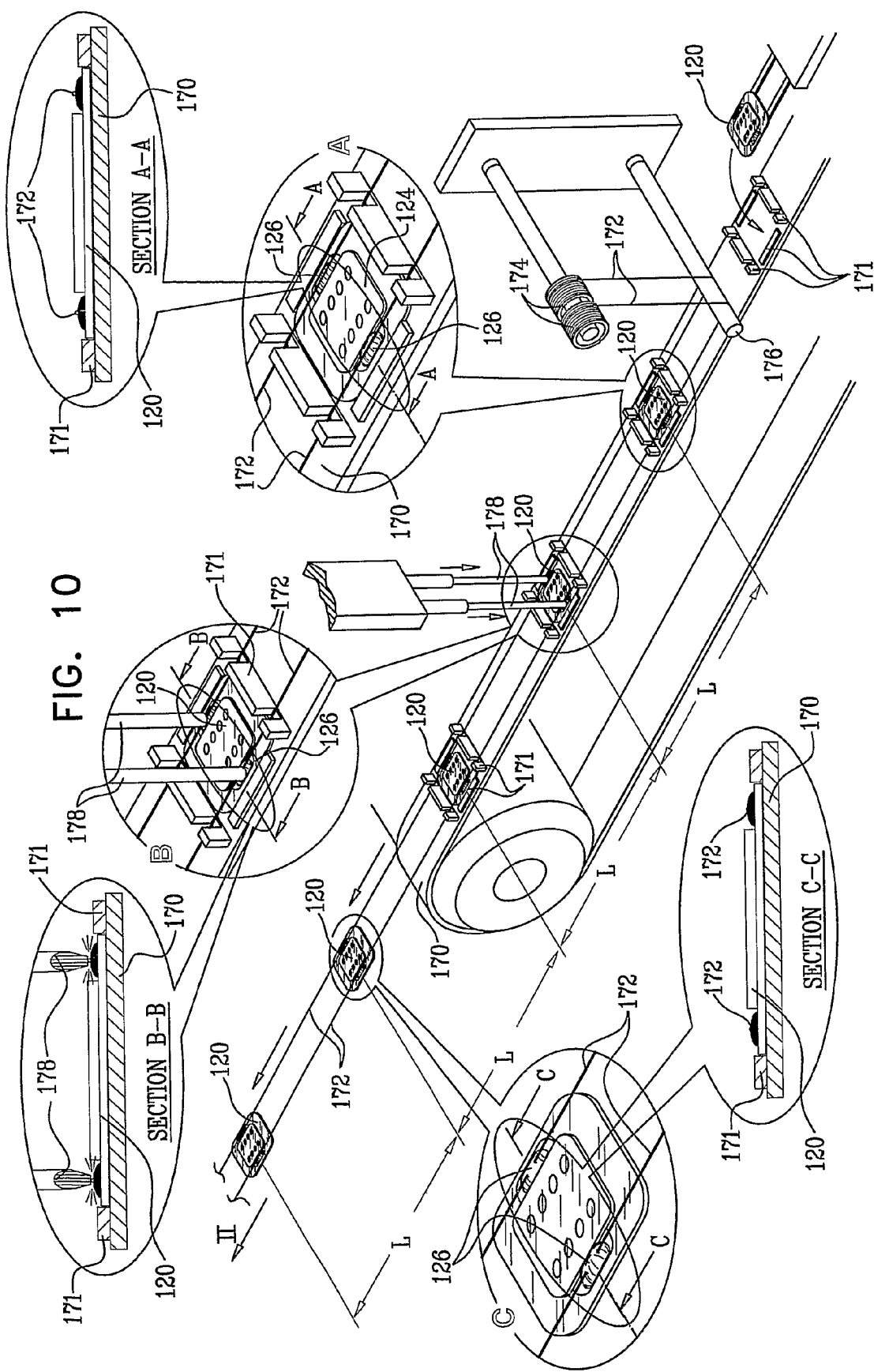

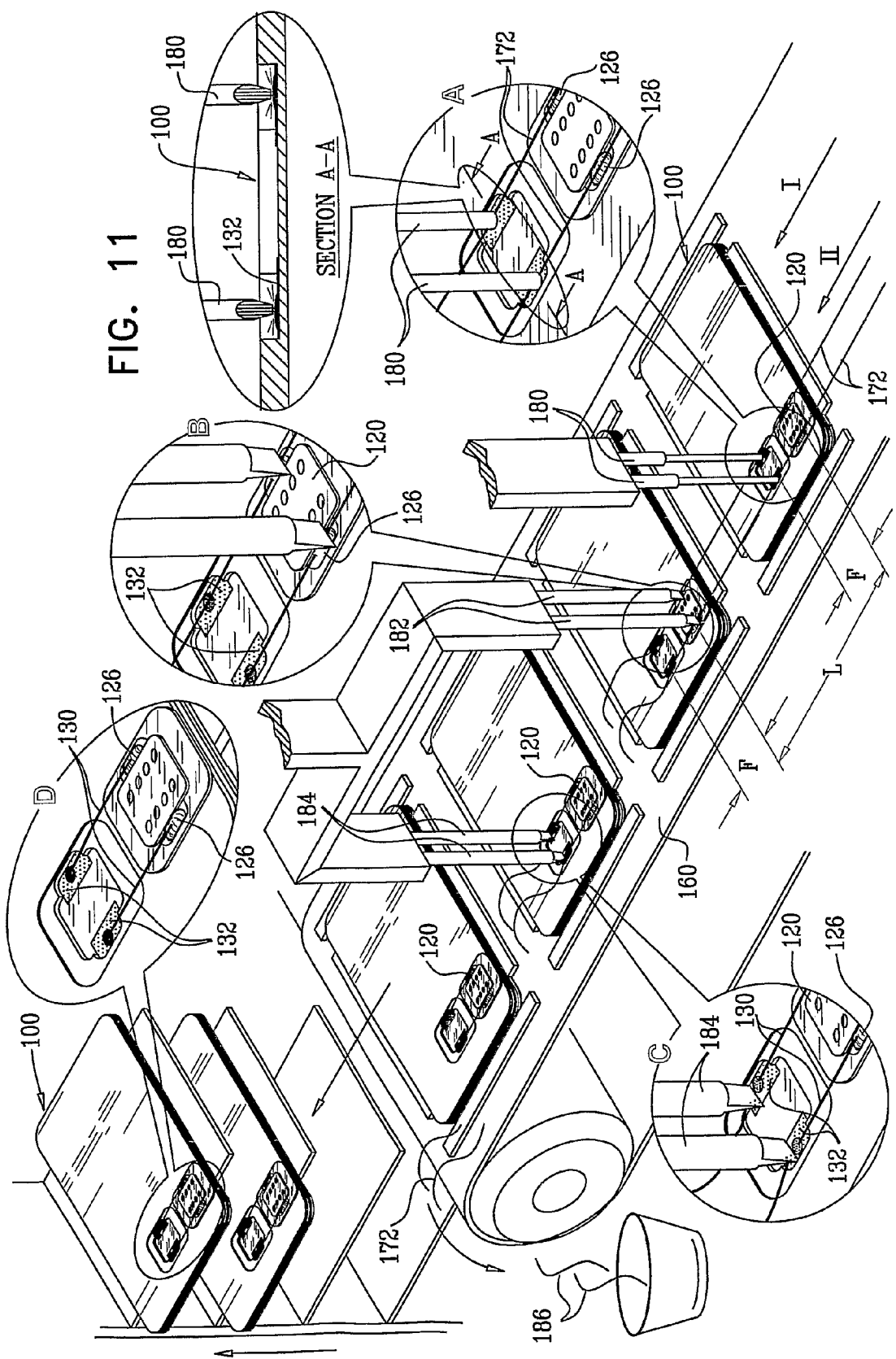

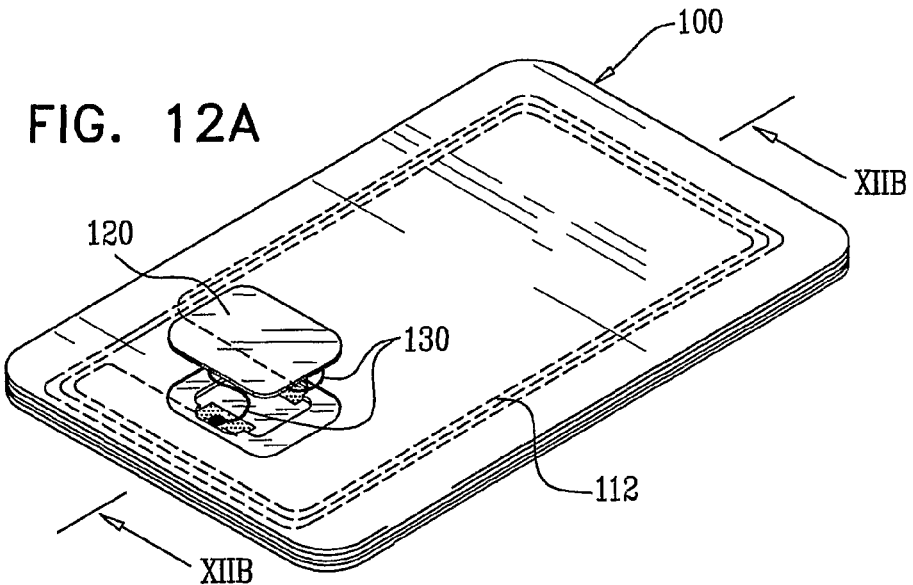
FIG. 12A
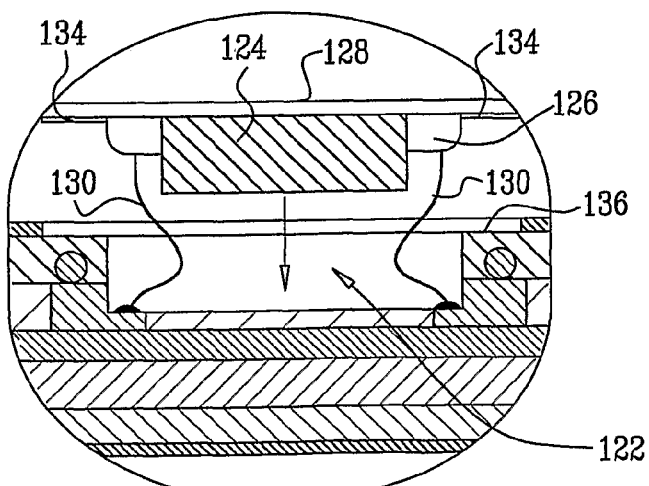
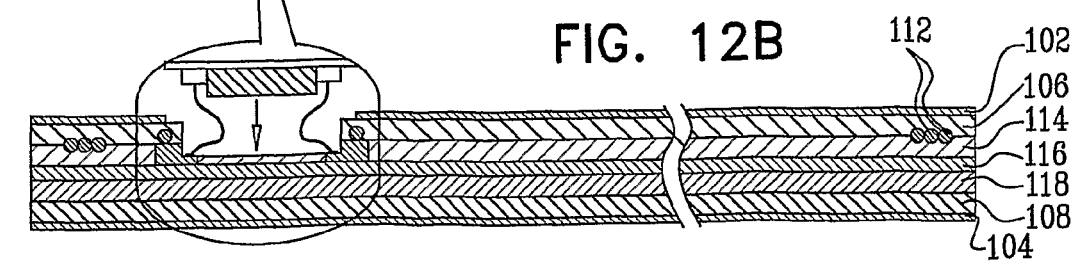
FIG. 12B

ELECTRONIC INTERFACE APPARATUS AND METHOD AND SYSTEM FOR MANUFACTURING SAME

CROSS-REFERENCE TO RELATED APPLICATIONS

This application claims priority to PCT International Application No. PCT/IL2008/001397 filed on Oct. 23, 2008, which claims priority to PCT International Application No. PCT/IL2007/001378 filed on Nov. 8, 2007, and PCT International Application No. PCT/IL2008/000538 filed on Apr. 17, 2008, incorporated by reference herein.

FIELD OF THE INVENTION

The present invention relates to electronic interface cards, also known as "smart cards" generally and more particularly to electronic interface cards having contact and/or contactless functionalities.

BACKGROUND OF THE INVENTION

The following U.S. patents are believed to represent the current state of the art:
U.S. Pat. Nos. 7,278,580; 7,271,039; 7,269,021; 7,243,840; 7,240,847, 7,204,427 and 6,881,605.

SUMMARY OF THE INVENTION

The present invention seeks to provide improved electronic interface cards and methods for manufacturing thereof.

There is thus provided in accordance with a preferred embodiment of the present invention, a method for manufacture of an electronic interface card including defining a pair of apertures in a substrate layer, associating an antenna with the substrate layer such that opposite ends of the antenna terminate at the apertures, placing a conductor in each of the apertures, connecting the antenna to the conductor, forming a recess in the substrate layer, attaching continuous connection wires to a plurality of chip modules, attaching the continuous connection wires to a plurality of conductors on a corresponding plurality of the substrate layers, cutting the continuous connection wires so as to retain portions thereof which connect each chip module to a corresponding pair of conductors and sealing the chip module in the recess.

Preferably, the method also includes laminating the substrate layer together with at least a top layer and forming a recess in the top layer overlying the recess in the substrate layer. Additionally, the top layer includes a first top substrate layer and a second top substrate layer.

In accordance with a preferred embodiment of the present invention the sealing includes placing an adhesive on an underside of the chip module and inserting the chip module into the recess such that the underside engages the recessed surface.

Preferably, the method also includes folding the wires underneath the chip module.

In accordance with a preferred embodiment of the present invention the method is automated and adjacent ones of the chip modules are spaced along the connection wires by a predetermined spacing and the conductors of adjacent ones of the cards are mutually spaced by the predetermined spacing, prior to the attaching the continuous connection wires to the plurality of conductors. Additionally or alternatively, the attaching the continuous connection wires to the conductors includes laser bonding. Alternatively or additionally, the attaching the continuous connection wires to a chip module includes soldering.

Preferably, the wires have a length substantially greater than the distance between their respective opposite ends in the electronic interface card.

There is also provided in accordance with another preferred embodiment of the present invention a method for manufacture of an electronic interface card including forming a substrate having at least one layer, forming an antenna in the at least one layer, connecting wires between a chip module and the antenna by: attaching continuous connection wires to a plurality of chip modules, attaching the continuous connection wires to a plurality of the antennas and cutting the continuous connection wires so as to retain portions thereof which connect each chip module to a corresponding antenna and mounting the chip module on the substrate.

Preferably, adjacent ones of the chip modules are spaced along the connection wires by a predetermined spacing and the antennas adjacent ones of the substrates are mutually spaced by the predetermined spacing, prior to the attaching the continuous connection wires to the plurality of antennas.

In accordance with a preferred embodiment of the present invention the wires have a length substantially greater than the distance between their respective opposite ends in the electronic interface card. Additionally or alternatively, the mounting including folding the wires underneath the chip module.

Preferably, the method is automated.

There is further provided in accordance with yet another preferred embodiment of the present invention a system for manufacturing an electronic interface card based on an electronic interface assembly including a substrate having at least one layer, at least two conductors located in the at least one layer and a wire antenna associated with the substrate and electrically coupled to the at least two conductors, the system including a recess former operative to form a recess in the substrate layer, wire attaching functionality operative for: attaching continuous connection wires to a plurality of chip modules, attaching the continuous connection wires to a plurality of conductors on a corresponding plurality of the substrate layers and cutting the continuous connection wires so as to retain portions thereof which connect each chip module to a corresponding pair of conductors and a sealer operative to seal the chip module in the recess.

Preferably, the system also includes a laminator operative to laminate the substrate layer together with a top layer and a bottom layer.

There is even further-provided in accordance with still another preferred embodiment of the present invention a method for manufacture of an electronic interface assembly including providing a substrate having at least one substrate layer, associating an antenna with the at least one substrate layer, connecting the antenna to conductors associated with the at least one substrate layer, attaching a chip module to the conductors by: attaching continuous connection wires to a plurality of chip modules, attaching the continuous connection wires to a plurality of the conductors on a corresponding plurality of the substrate layers and cutting the continuous connection wires so as to retain portions thereof which connect each chip module to a corresponding pair of conductors and sealing the chip module to the substrate.

Preferably, the method also includes defining a pair of apertures in a substrate layer such that opposite ends of the antenna terminate at the apertures and placing the conductors in each of the apertures prior to the connecting. Additionally or alternatively, the method also includes laminating the substrate layer together with a top layer and a bottom layer.

BRIEF DESCRIPTION OF THE DRAWINGS

The present invention will be understood and appreciated more fully from the following detailed description, taken in conjunction with the drawings in which:

FIGS. 4A and 4B are, respectively, simplified pictorial and sectional illustrations of a yet further step in the manufacture of the electronic interface card of FIG. 1;

FIGS. 5A and 5B are, respectively, simplified pictorial and sectional illustrations of a still further step in the manufacture of the electronic interface card of FIG. 1;

FIGS. 6A and 6B are, respectively, simplified pictorial and sectional illustrations of an additional step in the manufacture of the electronic interface card of FIG. 1;

FIGS. 7A and 7B are, respectively, simplified pictorial and sectional illustrations of a further additional step in the manufacture of the electronic interface card of FIG. 1;

FIGS. 8A and 8B are, respectively, simplified pictorial and sectional illustrations of a yet further additional step in the manufacture of the electronic interface card of FIG. 1;

FIG. 10 is a simplified pictorial illustration of a yet further additional step in the manufacture of the electronic interface card of FIG. 1;

FIG. 11 is a simplified pictorial illustration of a still further additional step in the manufacture of the electronic interface card of FIG. 1; and FIGS. 12A and 12B are, respectively, simplified pictorial and sectional illustrations of a final step in the manufacture of the electronic interface card of FIG. 1.

DETAILED DESCRIPTION OF A PREFERRED EMBODIMENT

Figure 1:
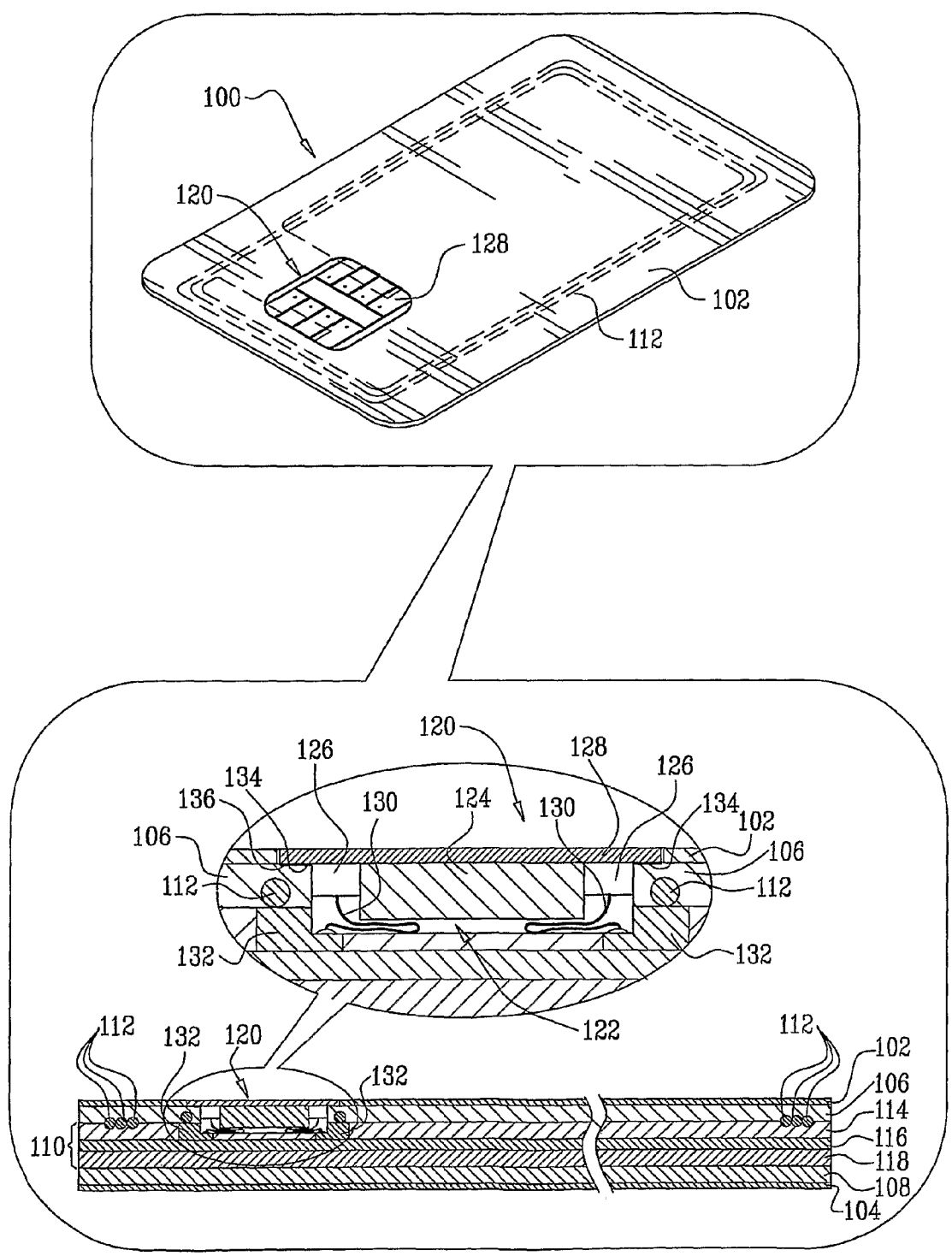
FIG. 1 is a simplified pictorial and sectional illustration of an electronic interface card having both contact and contactless functionalities, constructed and operative in accordance with a preferred embodiment of the present invention.

Reference is now made to FIG. 1, which illustrates an electronic interface card 100 having contact and/or contactless functionalities, constructed and operative in accordance with a preferred embodiment of the present invention. As seen in FIG. 1, electronic interface card 100 preferably comprises a multiple-layer substrate including top and bottom protection layers 102 and 104, typically formed of PVC (PolyVinyl Chloride), each typically of thickness 0.05 mm. Alternatively, protection layers 102 and 104 may be formed of any other suitable material, such as Teslin®, PET-G (PolyEthylene-Terephthalate-Glycol), PET-F (PolyEthyleneTerephthalate-Film), polycarbonate or ABS.

Disposed inwardly of both of protection layers 102 and 104 are preferably artwork layers 106 and 108, typically formed of PVC, each typically of thickness 0.15 mm, typically bearing artwork which is visible through respective protection layers 102 and 104. Alternatively, artwork layers 106 and 108 may be formed of any suitable material, such as Teslin®, PET-G (PolyEthyleneTerephthalate-Glycol), PET-F (PolyEthyleneTerephthalate-Film), polycarbonate or ABS. Alternatively, artwork layers 106 and 108 may be obviated.

Disposed inwardly of both of artwork layers 106 and 108 there is preferably provided an inlay 110 including a wire antenna 112, preferably of wire diameter 0.1 mm, embedded in a first inlay layer 114, typically formed of PVC, preferably of thickness 0.15 mm. Inlay 110 also includes second and third inlay layers 116 and 118, also preferably formed of PVC, of respective thicknesses 0.1 mm and 0.15 mm, respectively. Alternatively, first, second and third inlay layers 114, 116 and 118 may be formed of any other suitable material, such as Teslin®, PET-G (PolyEthyleneTerephthalate-Glycol), PET-F (PolyEthyleneTerephthalate-Film), polycarbonate or ABS.

A chip module 120 preferably is mounted in a recess 122 formed in electronic interface card 100. The chip module preferably includes a packaged smart card chip 124 having pads 126 and an array 128 of contacts, preferably of thickness 0.06 mm. Alternatively, contacts 128 may be obviated and smart card chip 124 may provide contactless functionality.

Electrical connections between the chip module 120 and the embedded antenna 112 are provided by wires 130, preferably of thickness 0.1 mm, which are preferably soldered at first ends thereof to pads 126 and laser bonded at opposite ends thereof to metal elements 132 which are bonded to respective ends of wire antenna 112. It is appreciated that where suitable, laser bonding and conventional soldering may be used interchangeably. It is a particular feature of the present invention that the length of wires 130 between pads 126 and respective metal elements 132 is substantially longer than the distance between pads 126 and metal elements 132 in the assembled card. This feature provides enhanced reliability.

A layer 134 of hot melt adhesive, disposed at the periphery of the underside of array 128 of contacts, retains the chip module 120 in recess 122, by engaging a corresponding recessed peripheral facing surface 136 of layer 106.

Figure 2:
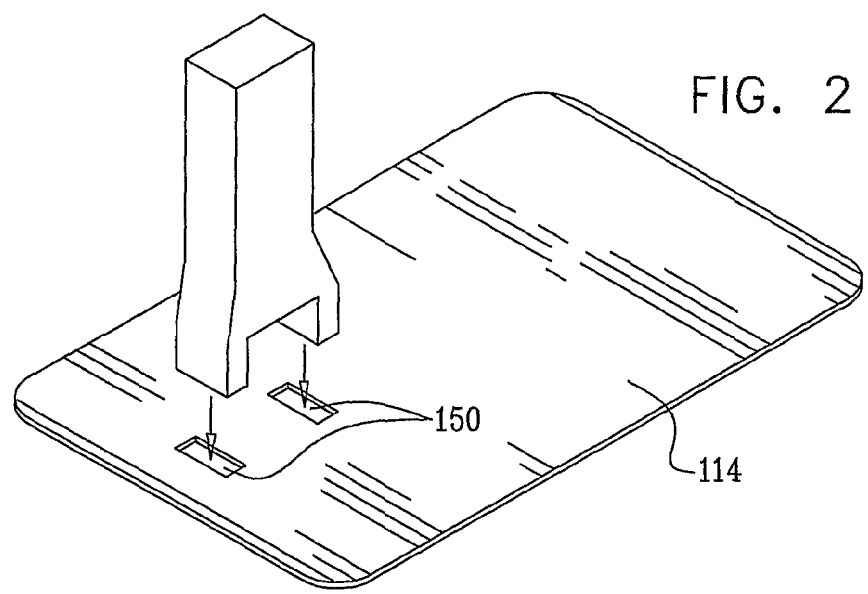
FIG. 2 is a simplified pictorial illustration of an initial step in the manufacture of the electronic interface card of FIG. 1.
Figure 3A:
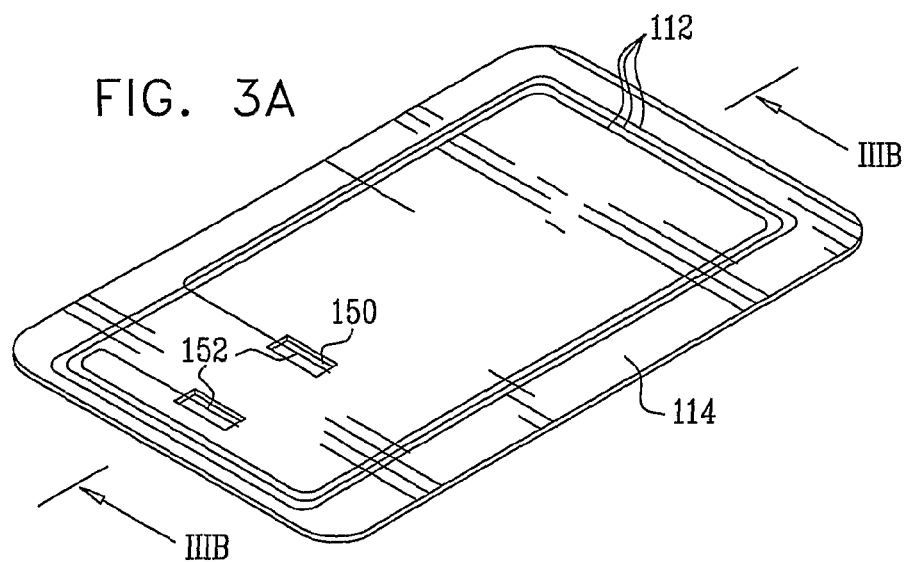
FIGS. 3A and 3B are, respectively, simplified pictorial and sectional illustrations of a further step in the manufacture of the electronic interface card of FIG. 1.
Figure 3B:
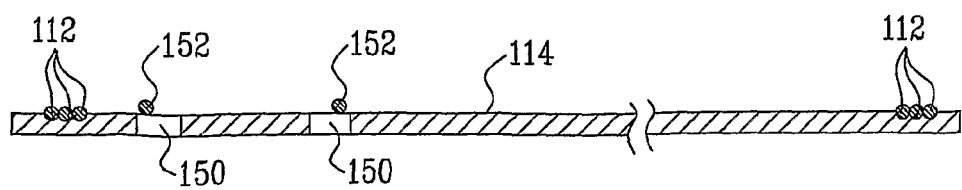

Reference is now made to FIG. 2, which is a simplified pictorial illustration of an initial step in the manufacture of the electronic interface card of FIG. 1 in which layer 114 is punched to define a pair of apertures 150. As see in FIGS. 3A and 3B, antenna 112 is associated with layer 114, as by known embedding techniques, typically employing an ultrasonic head commercially available from PCK Technology, Inc. of Islip, N.Y., U.S.A. Opposite ends 152 of antenna 112 terminate at apertures 150, as seen in FIGS. 3A and 3B.

Alternatively, antenna 112 may be a printed antenna formed on substrate 114 by suitable printing techniques or may be an antenna attached to substrate 114 by any suitable attachment method.

Turning now to FIGS. 4A and 4B, it seen that adhesive pads 154 are mounted onto layer 114 at corresponding edges 156 of apertures 150. As seen in FIGS. 5A and 5B, metal elements 132 are placed in apertures 150 and are retained in position therein by adhesive pads 154. Preferably the ends 152 of antenna 112 are connected to metal elements 132 by thermal-compression bonding or any other suitable technique. Following this connecting step, the adhesive pads 154 are no longer needed to retain the metal elements 132 in place and the pads 154 are removed. It is appreciated that alternatively adhesive pads 154 need not be removed.

At this stage, as seen in FIGS. 6A and 6B, layers 116 and 118 are provided onto the underside of layer 114 and layers 102, 104, 106 and 108 are all laminated together therewith, with the resulting laminated structure appearing as shown in FIGS. 7A and 7B.

Turning now to FIGS. 8A and 8B, it is seen that recess 122 is formed in layers 102, 106 and 114 and metal elements 132 and recessed peripheral facing surface 136 of layer 106 is exposed, preferably by milling. It is appreciated that alternatively the recess may be formed on the opposite surface of the card.

Figure 9:
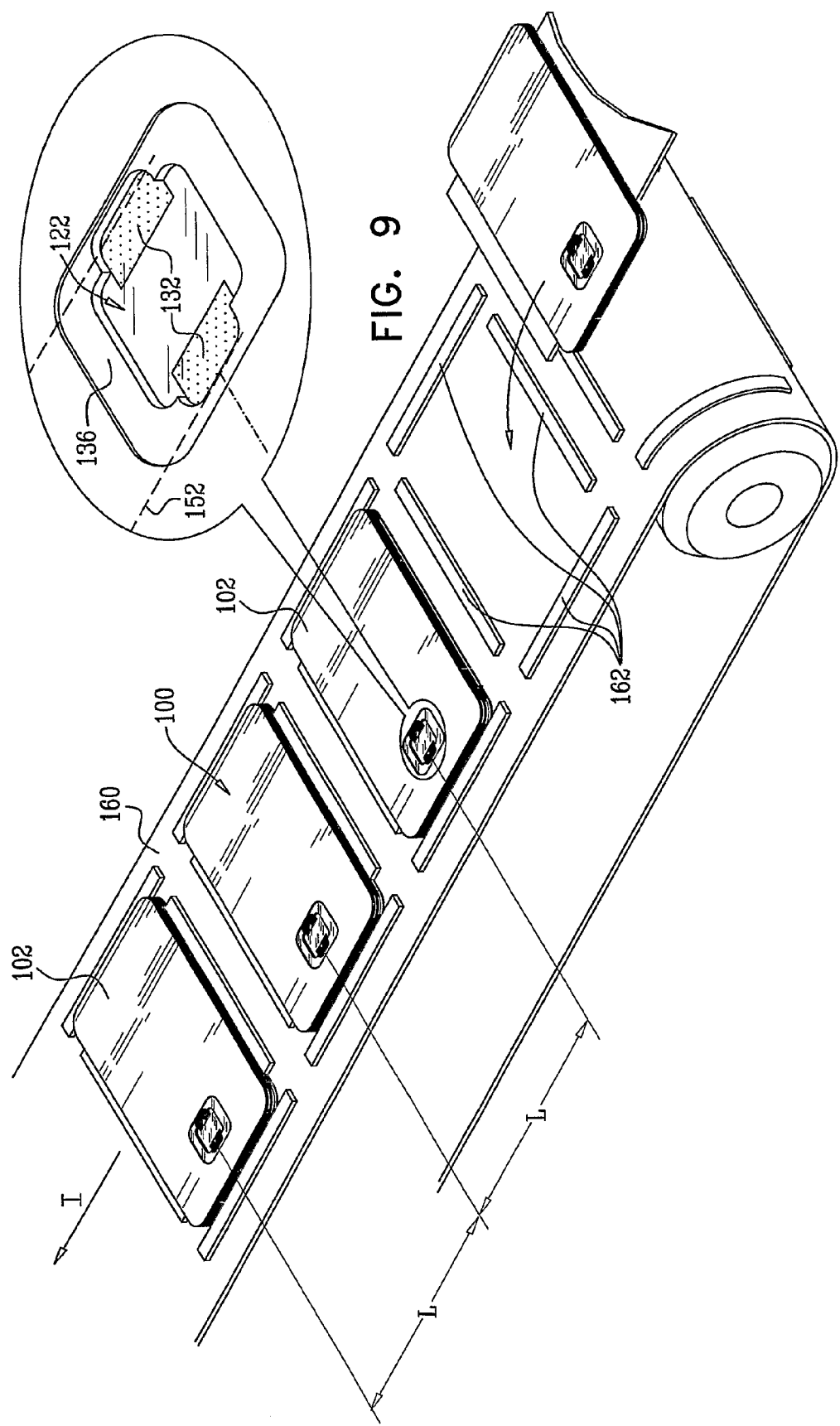
FIG. 9 is a simplified pictorial illustration of a still further additional step in the manufacture of the electronic interface card of FIG. 1.

Reference is now made to FIG. 9 which illustrates the partially assembled cards of FIG. 8B arranged and retained in spaced side-by-side arrangement along a conveyor belt 160 with precise spacing, here designated by "L", between metal elements 132 of adjacent cards. The precise spacing preferably is maintained by upstanding elements 162 formed on conveyor belt 160. Conveyor belt 160 displaces the partially assembled cards of FIG. 8B in a direction indicated by an arrow I.

Reference is now made to FIG. 10 which illustrates chip modules 120 (FIG. 1) arranged in spaced side-by-side arrangement along a conveyor belt 170 with precise spacing, "L" therebetween, the spacing being identical to spacing "L" between metal elements 132 of adjacent cards (FIG. 9). The precise spacing may be maintained, for example, by upstanding elements 171 formed on conveyor belt 170.

As seen in FIG. 10, a pair of continuous wires 172 are unwound from respective spools 174 over a mandrel 176 so as to extend over respective pads 126 of chip modules 120, in propinquity or touching pads 126, as illustrated clearly in Enlargement A and in Section A-A in FIG. 10. Preferably wires 172 are maintained under tension along their respective lengths.

Wires 172 are soldered to pads 126, for example, by a pair of heated soldering pins 178 which respectively engage wires 172 and pads 126. It is appreciated that where suitable, laser bonding and conventional soldering may be used interchangeably. Preferably, at this stage, seen in Enlargement B and in Section B-B, wires 172 are maintained under tension both along their respective lengths and downwardly against pads 126 so as to become at least partially embedded in pads 126 upon melting of the solder therein by soldering pins 178 and to be retained in an embedded position following engagement of the soldering pins, as seen in Enlargement C and in Section C-C. At this point, following solidifying of the solder in pads 126, the chip modules 120 are supported by wires 172 and are displaced in a direction indicated by an arrow II.

Reference is now made to FIG. 11, which illustrates assembly of the wire-mounted chip modules prepared as illustrated in FIG. 10 onto the partially assembled cards arranged as shown in FIG. 9. It is appreciated that the displacement directions I and II of the partially assembled cards of FIG. 9 and of the chip modules 120, supported by wires 172 are preferably identical. During continuous operation, the movement of conveyor belt 160 in direction I, engaging partially assembled cards 100 to which are welded wires 172 as described hereinbelow, is operative to tension wires 172.

As seen in Enlargement A and Section A-A of FIG. 11, wires 172 forward of a chip module 120 are soldered to metal elements 132 of partially assembled cards 100 by a pair of heated soldering pins 180. It is appreciated that where suitable, laser bonding and conventional soldering may be used interchangeably. The lengths of wire 172 extending between metal elements 132 of partially assembled cards 100 and respective pads 126 of chip modules 120 is indicated by "F" in FIG. 11. Subsequently wires 172 are cut, by respective cutting heads 182 and 184 just rearward of pads 126, as seen in Enlargement B, and just forward of metal elements 132, as seen in Enlargement C, thus leaving wires 130 (FIG. 1) of length F, interconnecting respective pads 126 of each chip module 120 with corresponding metal elements 132 of each partially assembled card. The remaining lengths of wire 172 are discarded, as indicated at reference numeral 186. The partially assembled, cards each connected to a chip module 120, as seen in Enlargement D, are then off-loaded from conveyor belt 160.

Turning now to FIGS. 12A and 12B, it is seen that following attachment of wires 130 to corresponding pads 126 of the chip module 120, and placement of hot melt adhesive 134 on the periphery of the underside of array 128, the chip module 120 is inserted into recess 122 such that the periphery of array 128 sealingly engages recessed peripheral facing surface 136 of layer 106. The insertion method is such that wires 130 are folded underneath the chip module 120, as seen in FIG. 1.

It is appreciated that the methodology described hereinabove with respect to FIGS. 1-12B is preferably highly automated.

It is appreciated that while the illustrated embodiment described herein includes substrate layers 102, 104, 106, 108, 114, 116 and 118, the multiple-layer substrate of electronic interface card 100 may include any suitable number of layers of any suitable thickness.

It is also appreciated that any or all of the layers of the multi-layer substrate of electronic interface card 100 may be formed of any of the materials described hereinabove, or any other suitable material, such as a composite material. Additionally, the layers of the multi-layer substrate of electronic interface card 100 need not be formed of the same material and each layer may be formed of a different material or different materials.

It will be appreciated by persons skilled in the art that the scope of the present invention is not limited by what has been particularly shown and described hereinabove. Rather, the invention includes both combinations and subcombinations of the various features described hereinabove as well modifications and variations thereof which would occur to persons skilled in the art upon reading the foregoing description together with the drawings and which are not in the prior art.

The invention claimed is:

1. A method for manufacture of an electronic interface card comprising:
    defining a pair of apertures in a substrate layer;
    associating an antenna with said substrate layer such that opposite ends of said antenna terminate at said apertures;
    placing a conductor in each of said apertures;
    connecting said antenna to said conductor;
    forming a recess in said substrate layer;
    attaching continuous connection wires to a plurality of chip modules;
    attaching said continuous connection wires to a plurality of conductors on a corresponding plurality of said substrate layers;
    cutting said continuous connection wires so as to retain portions thereof which connect each chip module to a corresponding pair of conductors; and
    sealing said chip module in said recess.

2. A method according to claim 1 and also comprising:
    laminating said substrate layer together with at least a top layer; and
    forming a recess in said top layer overlying said recess in said substrate layer.

3. A method according to claim 2 and wherein said top layer comprises a first top substrate layer and a second top substrate layer.

4. A method according to claim 3 wherein said sealing comprises:

placing an adhesive on an underside of said chip module; and inserting said chip module into said recess such that said underside engages said recessed surface.

5. A method according to claim 1 and also comprising folding said wires underneath said chip module.

6. A method according to claim 1 and wherein said method is automated and wherein adjacent ones of said chip modules are spaced along said connection wires by a predetermined spacing and said conductors of adjacent ones of said cards are mutually spaced by said predetermined spacing, prior to said attaching said continuous connection wires to said plurality of conductors.

7. A method according to claim 1 and wherein said attaching said continuous connection wires to said conductors comprises laser bonding.

8. A method according to claim 1 and wherein said attaching said continuous connection wires to a chip module comprises soldering.

9. A method for manufacture of an electronic interface card according to claim 1 and wherein said wires have a length greater than the distance between their respective opposite ends in said electronic interface card.

* * * * *